(12) United States Patent
Ahrens et al.

(10) Patent No.: US 9,236,290 B2
(45) Date of Patent: Jan. 12, 2016

(54) METHOD FOR PRODUCING A SEMICONDUCTOR DEVICE

(75) Inventors: Carsten Ahrens, Pettendorf (DE); Rudolf Berger, Regensburg (DE); Manfred Frank, Nittendorf (DE); Uwe Hoeckele, Regensburg (DE); Bernhard Knott, Neumarkt (DE); Ulrich Krumbein, Rosenheim (DE); Wolfgang Lehnert, Lintach (DE); Berthold Schuderer, Regensburg (DE); Juergen Wagner, Nittendorf (DE); Stefan Willkofer, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/365,774

(22) Filed: Feb. 3, 2012

(65) Prior Publication Data

US 2012/0289023 A1  Nov. 15, 2012

(30) Foreign Application Priority Data

Feb. 3, 2011 (DE) .......................... 10 2011 010 248

(51) Int. Cl.
*H01L 21/762* (2006.01)
*H01L 23/31* (2006.01)
*H01L 21/78* (2006.01)
*H01L 23/48* (2006.01)

(52) U.S. Cl.
CPC ...... *H01L 21/76232* (2013.01); *H01L 23/3185* (2013.01); *H01L 21/78* (2013.01); *H01L 23/481* (2013.01); *H01L 2924/0002* (2013.01)

(58) Field of Classification Search
CPC .................................................. H01L 21/762

USPC .......... 438/427, 404–406, 430; 257/E21.546
See application file for complete search history.

(56) References Cited

U.S. PATENT DOCUMENTS

| | | | |
|---|---|---|---|
| 5,024,970 A * | 6/1991 | Mori | 438/462 |
| 5,395,790 A * | 3/1995 | Lur | 438/445 |
| 5,536,675 A * | 7/1996 | Bohr | 438/427 |
| 6,599,812 B1 * | 7/2003 | Palara | 438/424 |

(Continued)

FOREIGN PATENT DOCUMENTS

| | | |
|---|---|---|
| DE | 102 02 881 A1 | 8/2003 |
| DE | 103 51 028 A1 | 6/2005 |

(Continued)

*Primary Examiner* — Kevin Parendo
*Assistant Examiner* — Lamont Koo
(74) *Attorney, Agent, or Firm* — Slater & Matsil, L.L.P.

(57) ABSTRACT

A method for producing a semiconductor device having a sidewall insulation includes providing a semiconductor body having a first side and a second side lying opposite the first side. At least one first trench is at least partly filled with insulation material proceeding from the first side in the direction toward the second side into the semiconductor body. The at least one first trench is produced between a first semiconductor body region for a first semiconductor device and a second semiconductor body region for a second semiconductor device. An isolating trench extends from the first side of the semiconductor body in the direction toward the second side of the semiconductor body between the first and second semiconductor body regions in such a way that at least part of the insulation material of the first trench adjoins at least a sidewall of the isolating trench. The second side of the semiconductor body is partly removed as far as the isolating trench.

21 Claims, 7 Drawing Sheets

(56) References Cited

U.S. PATENT DOCUMENTS

| | | |
|---|---|---|
| 7,378,741 B2 | 5/2008 | Mauder |
| 7,663,222 B2 | 2/2010 | Lohninger et al. |
| 2003/0143819 A1* | 7/2003 | Hedler et al. .................. 438/462 |
| 2006/0281363 A1* | 12/2006 | Trezza ........................ 439/502 |
| 2007/0145579 A1 | 6/2007 | Hoshino et al. |
| 2007/0158721 A1* | 7/2007 | Akamatsu ..................... 257/296 |
| 2008/0277765 A1* | 11/2008 | Lane et al. .................... 257/622 |
| 2009/0061595 A1 | 3/2009 | Weber et al. |
| 2009/0146312 A1* | 6/2009 | Sulfridge ...................... 257/774 |
| 2009/0325346 A1* | 12/2009 | Hoshino et al. ............... 438/113 |
| 2010/0207227 A1 | 8/2010 | Meyer-Berg |
| 2011/0169159 A1* | 7/2011 | Lin et al. ....................... 257/692 |

FOREIGN PATENT DOCUMENTS

| | | |
|---|---|---|
| DE | 10 2005 004 160 A1 | 8/2006 |
| DE | 10 2010 000 417 A1 | 8/2010 |
| EP | 685882 A1 * | 12/1995 |

* cited by examiner

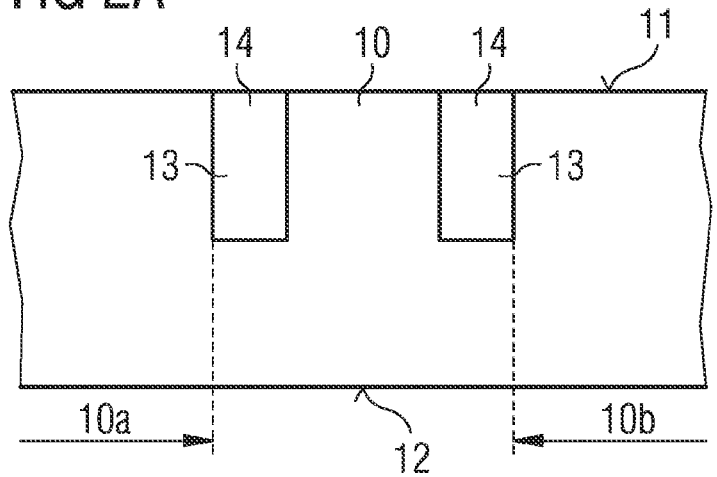
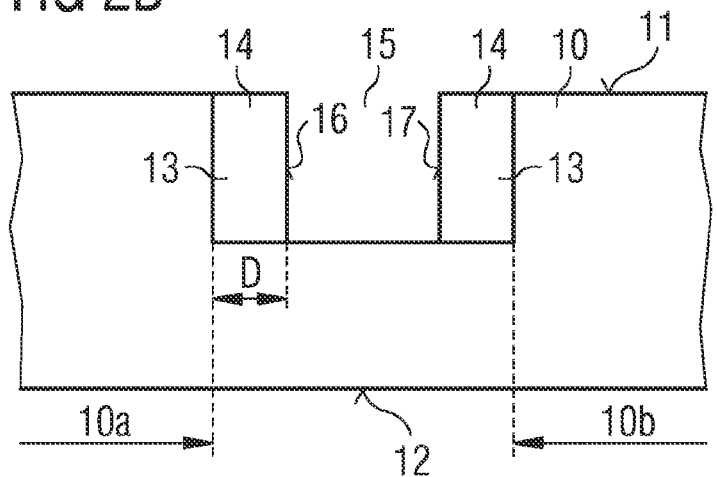
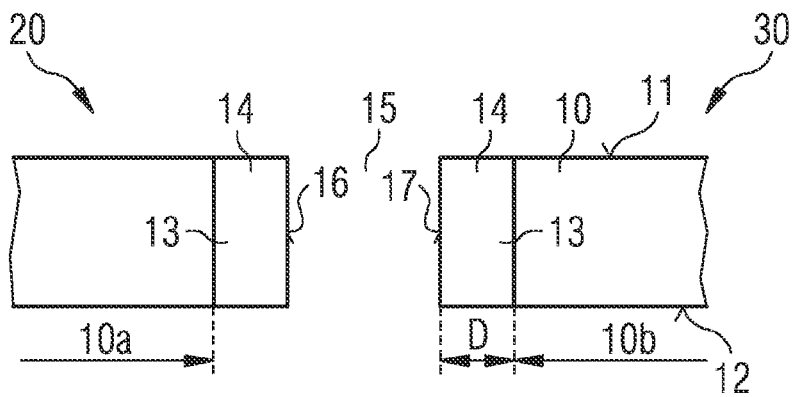

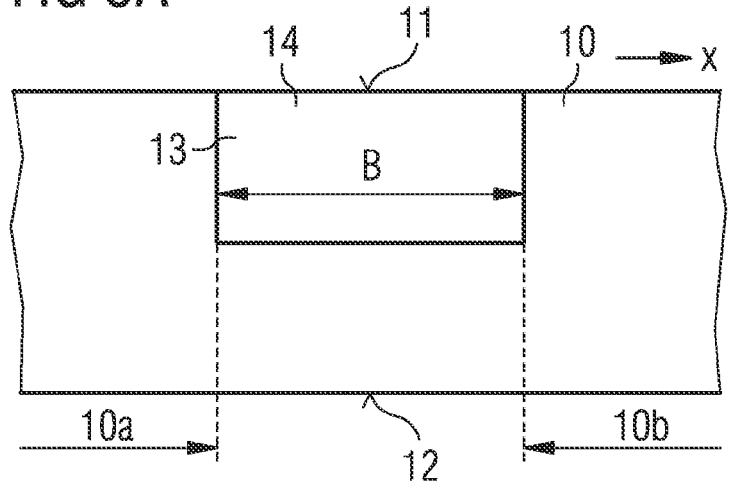
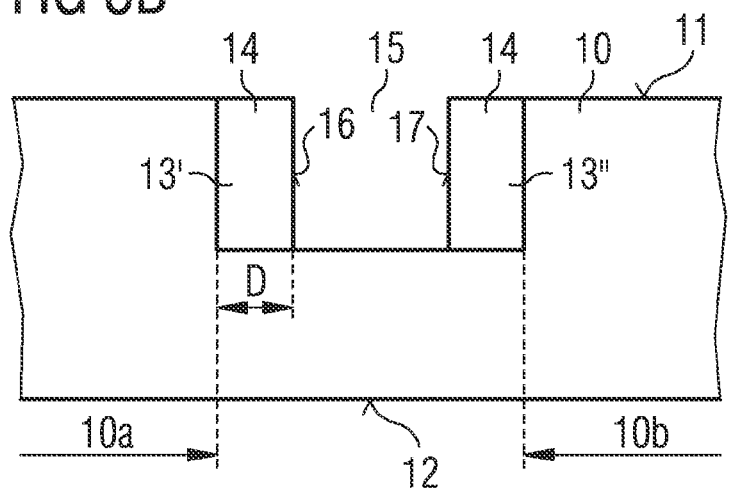
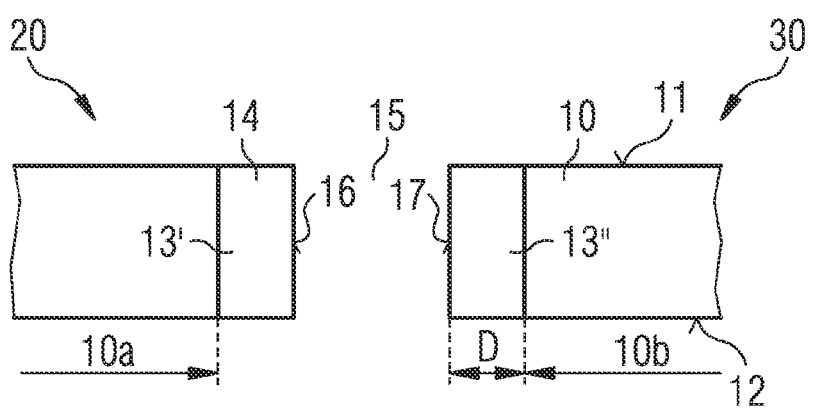

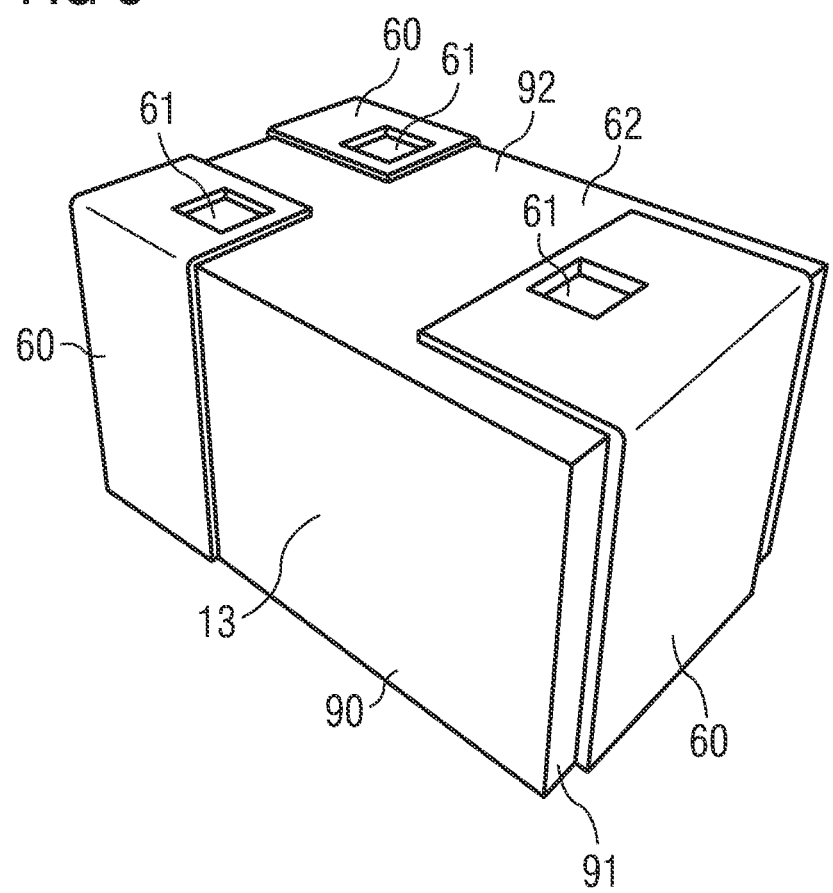

METHOD FOR PRODUCING A SEMICONDUCTOR DEVICE

This application claims priority to German Patent Application 10 2011 010 248.5, which was filed Feb. 3, 2011 and is incorporated herein by reference.

TECHNICAL FIELD

Exemplary embodiments of the invention relate to a method for producing a semiconductor device having a sidewall insulation.

BACKGROUND

Semiconductor devices having sidewall insulation are necessary, for example. for CSP (chip size package) device packages, wherein, in a particularly space-saving embodiment, a contact area is formed at a sidewall of a semiconductor body. The contact area is insulated from the semiconductor body by a sidewall insulation layer. Such an embodiment is described, e.g., in German publication DE 10 2005 004 160 A1 and U.S. counterpart U.S. Pat. No. 7,663,222 B2.

Further examples of semiconductor devices having sidewall insulation are additionally known for power semiconductor components. Such a semiconductor device is described, for example, in German publication DE 103 51 028 A1 and U.S. counterpart U.S. Pat. No. 7,378,741.

SUMMARY

In one aspect, the invention provides a method for producing a semiconductor device having a sidewall insulation. For example, a thick sidewall insulation.

In one embodiment, a semiconductor device having a sidewall insulation is featured. A semiconductor body has a first side and a second side lying opposite the first side. At least one first trench is at least partly filled with insulation material extending from the first side in the direction toward the second side into the semiconductor body. The at least one first trench is produced between a first semiconductor body region for a first semiconductor device and a second semiconductor body region for a second semiconductor device.

An isolating trench is found proceeding from the first side of the semiconductor body in the direction toward the second side of the semiconductor body between the first and second semiconductor body regions in such a way that at least part of the insulation material of the first trench adjoins at least a sidewall of the isolating trench. The second side of the semiconductor body is at least partially removed as far as the isolating trench.

By producing the trench at least partly filled with insulation material and producing the isolating trench in a separate step, it is possible to form the sidewall insulation without an overhang at sidewalls of the semiconductor body which extend perpendicularly to the surface of the semiconductor body. In particular, this applies to thick sidewall insulations having layer thicknesses of >2 µm. Such an overhang would be disadvantageous, for example, for subsequent patterning of a sidewall metallization because this can give rise to shading during the lithography step. By virtue of avoiding this shading caused by the overhang, the patterning of subsequent electrically conductive layers at the sidewalls is possible in a sufficiently reproducible or controlled manner. Moreover, the production of the first trench at least partly filled with insulation material can be concluded before the production of the functional semiconductor structures of a semiconductor component in the semiconductor device. As a result, there is no influence on the production of the semiconductor component structures, such as, e.g., outdiffusions during a thermal oxidation. Therefore, it is also possible to use high-temperature processes for the production of the sidewall insulation.

One development of the method is if at least two first trenches are produced between the first and second semiconductor body regions, wherein the isolating trench is produced between two of the first trenches. Particularly if at least part of the insulation material of a respective first trench adjoins two opposite sidewalls of the isolating trench, it is possible, for example, to produce a plurality of semiconductor devices simultaneously with a sidewall insulation.

An alternative embodiment for simultaneously producing a plurality of semiconductor devices having a sidewall insulation is if the isolating trench is produced in the at least one first trench. That is applicable, in particular, if the insulation material of the first trench adjoins two opposite sidewalls of the isolating trench.

One embodiment provides for the first trench to have a width B of at least 2 µm and the isolating trench to be produced in such a way that an insulation layer composed of the insulation material of the first trench having a thickness D of at least 2 µm adjoins the at least one sidewall of the isolating trench. The at least 2 µm thick insulation layer produced in this way makes it possible to reduce, for example, parasitic capacitances between the semiconductor body and a subsequently applied exemplary metal layer on the sidewalls. Moreover, in the case of a power semiconductor component, it is possible to avoid an electrical breakdown through the insulation layer.

One exemplary embodiment for producing the first trench comprises the following features. At least two subtrenches are produced alongside one another in the region of the first trench to be produced, extending from the first side in the direction toward the second side into the semiconductor body in such a way that a ridge of the semiconductor body is formed between the two subtrenches. The ridge between the two subtrenches is converted into an insulation material.

By producing such a lamellar array of the semiconductor body with subsequent conversion of the ridge into an insulation region, it is possible to produce an insulating spatial volume having any desired width and/or depth for the sidewall insulation. In a further exemplary embodiment, an unfilled part of the subtrench possibly remaining after the process of converting the ridge into an insulation material can be filled with a material, in order to achieve, for example, a higher mechanical stability. In order to improve the insulation properties, the remaining unfilled part of the subtrench can also be filled with an insulation material. It is particularly advantageous if the remaining unfilled part of the subtrench is filled with a material that has a stress-reducing effect. This is because, in the case of the use of shifting materials having different physical properties such as, e.g., materials having different lattice constants or having different coefficients of thermal expansion, mechanical stress can occur between the material combinations. In order to compensate for this mechanical stress brought about, e.g., between the semiconductor body and the insulation material, use is made of a material for stress compensation. In this case, this material should have those physical parameters which counteract the stress-causing physical parameters of the other materials.

One embodiment for producing the first trench provides for the ridge to be converted into the insulation material by oxidation. By thermal oxidation, in particular, the ridge composed of semiconductor material, such as, e.g., silicon, can thereby be converted into an insulation material in a very simple manner.

One development of the method is, after producing the at least one first trench, in each case at least one dopant region is formed in the semiconductor body for the first and second semiconductor devices. By way of example, functional regions for the desired semiconductor components in the semiconductor device are thus produced.

A further development of the method is, after producing the isolating trench, an electrically conductive layer is produced on the insulation material of the first trench, which insulation material adjoins the sidewall of the isolating trench, in the isolating trench. This gives rise, e.g., to metallization layers on the sidewalls of the semiconductor device. Particularly by virtue of the fact that the electrically conductive layer is produced in such a way that it extends from the insulation material of the first trench that adjoins the sidewall of the isolating trench as far as at least one dopant region, wherein the at least one dopant region and the insulation material are assigned to the same semiconductor device, it is possible to utilize the electrically conductive layer as a connection pad for the semiconductor components of the semiconductor device. In this case, the positioning of the connection pads on the sidewalls is particularly space-saving and allows the production of small semiconductor devices.

One development of this space-saving arrangement is if an electrically conductive contact element is formed between the electrically conductive layer and the at least one dopant region, such that an electrical connection is produced between the at least one dopant region and the electrically conductive layer.

One embodiment of the method is if the semiconductor body is provided with an insulation layer, running parallel to the surface of the first side of the semiconductor body, in the semiconductor body. For this purpose, it is possible to use SOI material, for example. Particularly if the at least first trench is produced as far as the insulation layer running parallel to the surface of the first side in the semiconductor body, it is possible to set the depth of the first trench in the semiconductor body very exactly. For this purpose, the insulation layer is embedded in the desired depth, corresponding to the height of the later semiconductor device. The production of the first trench, in particular of subtrenches possibly used therefor, can end on the insulation layer in a defined manner during etching processes, for example. Moreover, the insulation layer affords the advantage that the later semiconductor device can have a rear side protected by the insulation layer if the second side of the semiconductor body is removed as far as the insulation layer.

In one embodiment, the sidewall of the isolating trench can be produced with a positive flank angle. In this case, a positive flank angle means that the isolating trench tapers from the first side in the direction toward the second side. As a result of the positive flank angle, the production of the electrically conductive layer on the insulation material can be significantly simplified because it is possible to avoid shading in the lithography step for patterning the electrically conductive layer as a result of a possibly occurring overhang at the sidewall insulation.

BRIEF DESCRIPTION OF THE DRAWINGS

FIG. 1, show an exemplary embodiment of a method for producing a semiconductor device having a sidewall insulation in schematic cross-sectional views;

FIGS. 2A-2C, collectively FIG. 2, show an exemplary embodiment of a method for producing a semiconductor device having a sidewall insulation in schematic cross-sectional views;

FIGS. 3A-3C, collectively FIG. 3, show an exemplary embodiment of a method for producing a semiconductor device having a sidewall insulation in schematic cross-sectional views;

FIG. 4, show an exemplary embodiment of a method for producing a trench at least partly filled with insulation material in schematic cross-sectional views;

FIG. 9 shows a semiconductor device in a three-dimensional illustration.

DETAILED DESCRIPTION OF ILLUSTRATIVE EMBODIMENTS

Exemplary embodiments of the invention are explained in greater detail below, referring to the accompanying figures. However, the invention is not restricted to the embodiments specifically described, but rather can be modified and altered in a suitable manner. It lies within the scope of the invention to suitably combine individual features and feature combinations of one embodiment with features and feature combinations of another embodiment in order to arrive at further embodiments according to the invention.

Before the exemplary embodiments of the present invention are explained in greater detail below with reference to the figures, it is pointed out that identical elements in the figures are provided with the same or similar reference signs, and that a repeated description of these elements is omitted. Furthermore, the figures are not necessarily true to scale; rather, the main emphasis is on elucidating the basic principle.

Figure 1A:
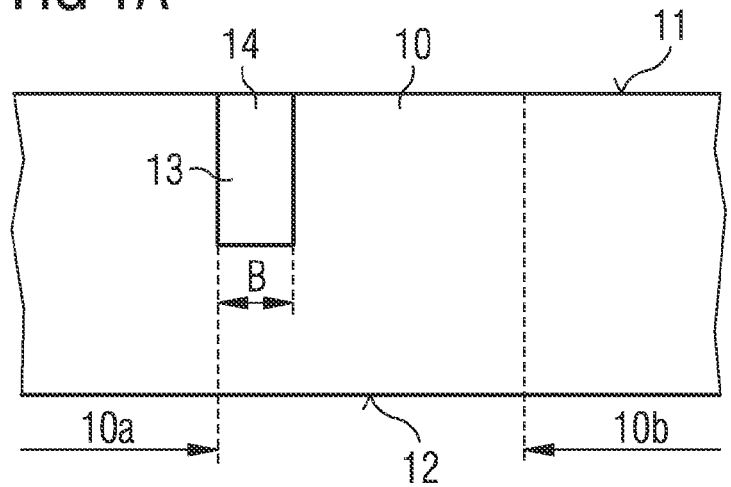
FIGS. 1A-1C, collectively

In FIG. 1A, a semiconductor body 10 is provided as starting material. The semiconductor body 10 can be produced, for example, from monocrystalline silicon, silicon carbide, gallium nitrite, gallium arsenide or some other semiconducting material. The semiconductor body is generally embodied in plate-type fashion with a first side 11 and a second side 12 lying opposite the first side 11. In this case, the semiconductor body 10 can be in its original form a slice, also often designated as a "wafer." In further production steps, the slice can subsequently also be separated into small individual parts (chips, semiconductor devices).

In the semiconductor body 10, at least one first trench 14 is produced which extends into the semiconductor body 10 proceeding from the first side 11 in the direction toward the second side 12. The first trench 14 can in this case be produced, for example, by an etching process into the semiconductor body, in a particular example by means of a dry-chemical etching process. In this case, the at least one first trench 14 is produced between a first semiconductor body region 10*a* for a first semiconductor device and a second semiconductor body region 10*b* for a second semiconductor device and is at least partly filled with an insulation material 13. In this case, in one advantageous embodiment, the first trench should have at least a width B>2 μm and be at least partly filled with an at least 2 μm thick insulation layer on the sidewalls of the first trench 14. In this case, by way of example, silicon oxide, silane oxide or some other electrically insulating material is appropriate as the insulation material 13. The at least partial filling of the first trench 14 with the insulation material 13 can be effected, for example, by depositing the insulation material at least on the sidewalls of the first trench 14.

Another possibility for producing a first trench 14 at least partly filled with insulation material 13 would be to convert the semiconductor material of the semiconductor body 10 into an insulation material 13 by a conversion process such as, e.g., oxidation, in particular thermal oxidation. In this case, the first trench 14 at least partly filled with insulation material is initially at least not completely etched out from the semiconductor body, rather the first trench 14 will arise as a result of the conversion of the semiconductor material into an insulation material 13 in the semiconductor body 10. A suitable process for converting a semiconductor material into an insulation material is known, for example, for producing field oxides or as the LOCOS process in conventional silicon technologies and comprises thermal oxidation of the semiconductor material.

Figure 1B:
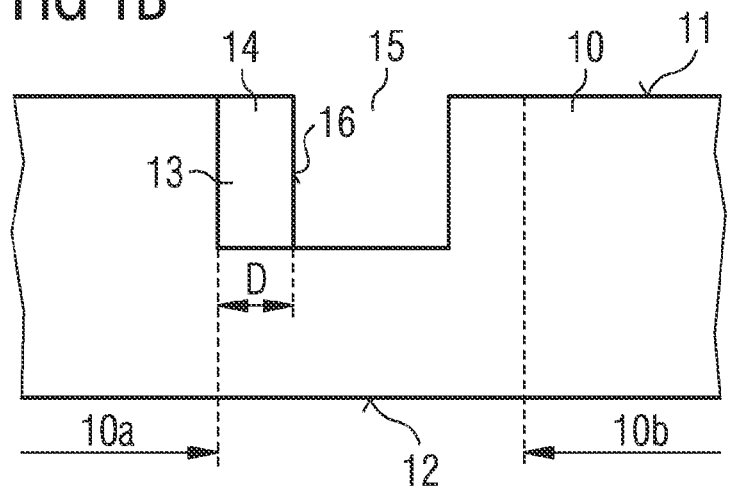

FIG. 1B illustrates the result of a further method step, wherein an isolating trench 15 was produced. In this case, the isolating trench 15 likewise extends in a manner proceeding from the first side 11 of the semiconductor body 10 in the direction toward the second side 12 of the semiconductor body 10. The isolating trench 15 is produced between the first and second semiconductor body regions 10*a*, 10*b* in such a way that it adjoins at least part of the insulation material 13 of the first trench 14 at least with a sidewall 16. In one advantageous exemplary embodiment, the sidewall 16 of the isolating trench 15 has a positive flank angle, that is to say that the isolating trench tapers from the first side 11 in the direction toward the second side 12. The isolating trench 15 can, for example, likewise be produced by an etching process into the semiconductor body 10. In this case, the isolating trench 15 can be produced in a self-aligned manner by selective etching with respect to the insulation material 13. In this case, the insulation material 13 serves as a hard mask for the semiconductor material etching. The isolating trench 15 can be embodied either with a smaller depth than, the same depth as, or even with a somewhat larger depth than, the first trench 14. It is advantageous, however, if the first trench 14 and the isolating trench 15 are embodied with approximately the same depth. The isolating trench 15 is preferably produced after the first trench 14.

Figure 1C:
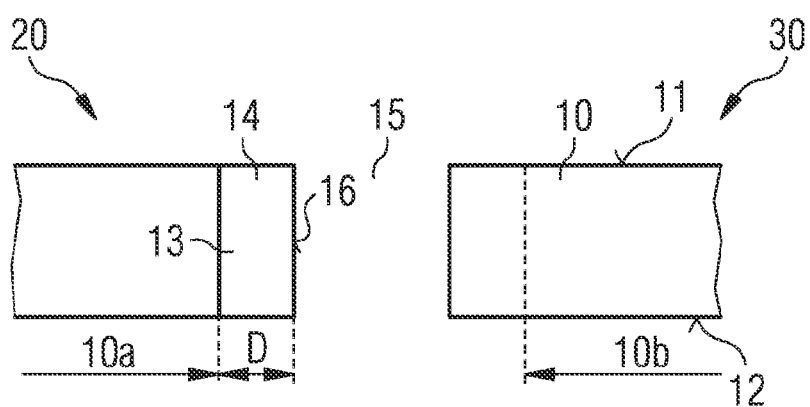

FIG. 1C schematically shows two singulated semiconductor devices 20 and 30. The singulation of the semiconductor devices 20, 30 from the semiconductor body 10 is effected by at least partly removing the second side 12 of the semiconductor body 10 as far as the isolating trench 15. The at least partial removal of the second side 12 of the semiconductor body 10 is effected, e.g., by a grinding process or a combined grinding and etching process (CMP). However, it is also possible to carry out a sawing step at the rear side, which involves severing the semiconductor body 10 below the isolating trench 15, for example, using a saw blade or a laser cutter.

FIG. 2 shows an exemplary embodiment of a method for producing a semiconductor device having a sidewall insulation, wherein, in contrast to the exemplary embodiment in accordance with FIG. 1, two first trenches 14 at least partly filled with insulation material 13 are produced between the first semiconductor body region 10*a* and the second semiconductor body region 10*b*. FIG. 2A illustrates two first trenches 14 by way of example. In this case, the two first trenches 14 are produced in a manner spaced apart from one another. In this case, a first trench 14 directly adjoins the first semiconductor body region 10*a* and the other first trench 14 directly adjoins the second semiconductor body 10*b*. Both the first trenches 14 are preferably produced simultaneously.

As shown in FIG. 2B, the isolating trench 15 is produced between these two first trenches 14. In this case, one sidewall 16 of the isolating trench 15 directly adjoins the insulation material 13 of one first trench 14, while the other sidewall 17 of the isolating trench 15 directly adjoins the insulation material 13 of the other first trench 14.

FIG. 2C illustrates the two semiconductor devices 20 and 30 which arise after the removal of the second side of the semiconductor body 10, that is to say after a process of thinning the semiconductor body 10, as far as the isolating trench 15. The sidewalls of the respective semiconductor device 20 or 30 are thus formed by the insulation material 13. Therefore, each of the semiconductor devices 20 and 30 produced has a sidewall insulation preferably over the entire sidewall. The sidewall insulation should preferably have a thickness D of at least 2 μm.

FIG. 3 shows a further exemplary embodiment of a method for producing a semiconductor device having sidewall insulation. As illustrated in FIG. 3A, in this case firstly a wide first trench 14 filled with insulation material 13 is produced into the semiconductor body 10 proceeding from the first side 11 in the direction toward the second side 12. In this case, the wide first trench 14 is likewise arranged between the first semiconductor body zone 10*a* and the second semiconductor body zone 10*b* and in this case extends in a lateral direction x completely between these two semiconductor body regions 10*a* and 10*b*. In this case, in one advantageous embodiment, the width B of the first trench 14 should be >4 μm.

As shown in FIG. 3B, the isolating trench 15 is produced in the first trench 14, such that the isolating trench 15 divides the insulation material 13 into two separate insulation layers 13' and 13" each having a thickness D. The sidewalls 16 and 17 of the isolating trench 15 therefore directly adjoin the remaining insulation material 13 of the insulation layers 13' and 13". In this case, the depth of the isolating trench 15 should preferably be at least as deep as the depth of the first trench 14. It is advantageous if the depths of the first trench 14 and of the isolating trench 15 are identical.

In the subsequent process for thinning the semiconductor body, as illustrated in FIG. 3C, two separate semiconductor devices 20 and 30 are produced by the removal of the semiconductor body 10 at the second side 12 as far as the isolating trench 15. In this case, the sidewalls of the respective semiconductor devices have a sidewall insulation formed by the insulation layers 13' and 13". In this case, the previously produced isolating trench 15 should preferably have been produced such that the sidewall insulation has a remaining thickness D>2 μm.

Figure 4A:
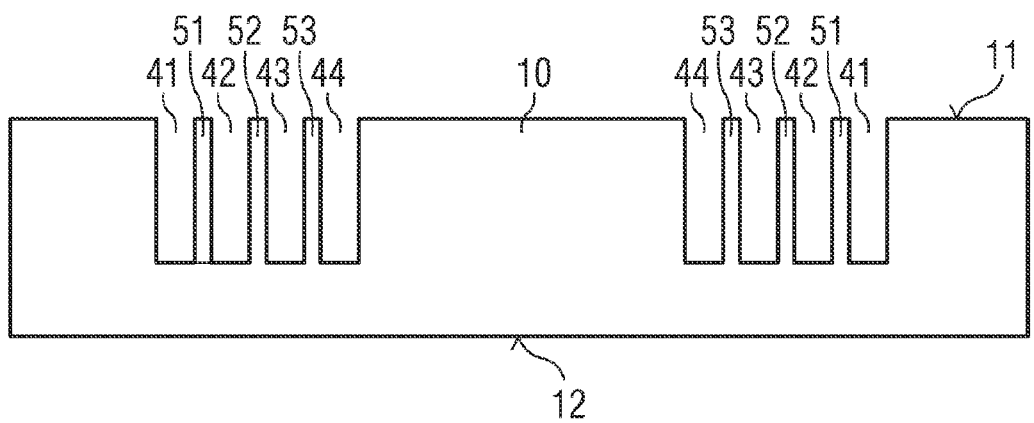
FIGS. 4A-4C, collectively

FIG. 4 shows an embodiment for producing a first trench at least partly filled with insulation material. As illustrated in FIG. 4A, in a region of the semiconductor body 10 in which a first trench 14 is intended to be formed, a plurality of subtrenches 41, 42, 43 and 44 lying alongside one another are produced into the semiconductor body 10 proceeding from the first side 11 in the direction toward the second side 12. The subtrenches 41, 42, 43 and 44 are produced in this case, for example, by means of a masked etching process, in particular a dry-chemical etching process, wherein a patterned etching mask on the first side 11 of the semiconductor body 10 is applied and the etching of the semiconductor material takes place at the unmasked surface regions of the semiconductor body 10. It is advantageous if the unmasked surface regions for etching the subtrenches are as far as possible of the same size, because very similar subtrenches having almost identical dimensions thus arise. In particular the depth of the individual subtrenches 41 to 44 can thus be produced very uniformly. As a result of the production of the subtrenches 41, 42, 43 and 44, thin ridges 51, 52 and 53 of the semiconductor body 10 are formed between the subtrenches 41 to 44. The subtrenches 41 to 44 should preferably be produced with a spacing of <2 µm, in order that a ridge having a width of <2 µm respectively remains between the subtrenches 41 to 44.

Figure 4B:
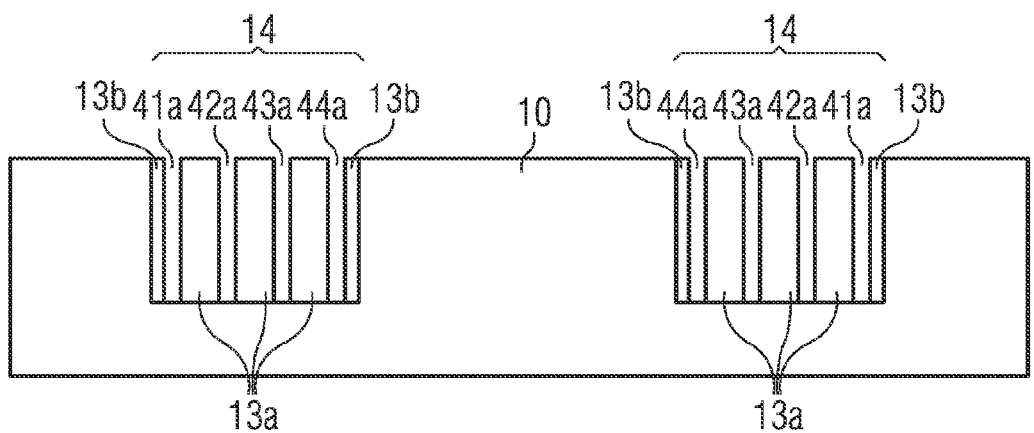

As indicated in FIG. 4B, the ridges 51, 52 and 53 between the subtrenches 41 to 44 are converted into an insulation material. This is effected, for example, by means of an oxidation process, in particular by means of thermal oxidation of the semiconductor material of the semiconductor body 10. Using the example of a silicon semiconductor material, therefore, $SiO_2$ regions 13*a* thus arise as a result of the conversion of the ridges into an insulation material. Moreover, upon the exemplary thermal oxidation of silicon, $SiO_2$ insulation regions 13*b* also arise in the semiconductor body, which form the outermost edge of the first trench 14 thus produced. If, as shown in FIG. 4B, unfilled parts 41*a* 42*a*, 43*a* and 44*a* of the subtrenches still remain after the conversion of the ridges 51, 52 and 53 into insulation regions 13*a*, the remaining unfilled parts 41*a* to 44*a* of the subtrenches can optionally be filled with a material. In particular, the remaining unfilled parts of the subtrenches can also be filled with an insulation material. For this purpose, by way of example, TEOS is appropriate for conformal filling. In this case, one advantageous embodiment is if the remaining unfilled part of the subtrench is filled with a material that has a stress-reducing effect. This is taken to mean materials which counteract a mechanical stress that arises on account of the different material properties of the semiconductor body 10 and of the insulation regions 13*a* and 13*b* converted into the insulation material 13. By way of example, but without restriction, amorphous silicon shall be mentioned here as stress-reducing material.

Figure 4C:
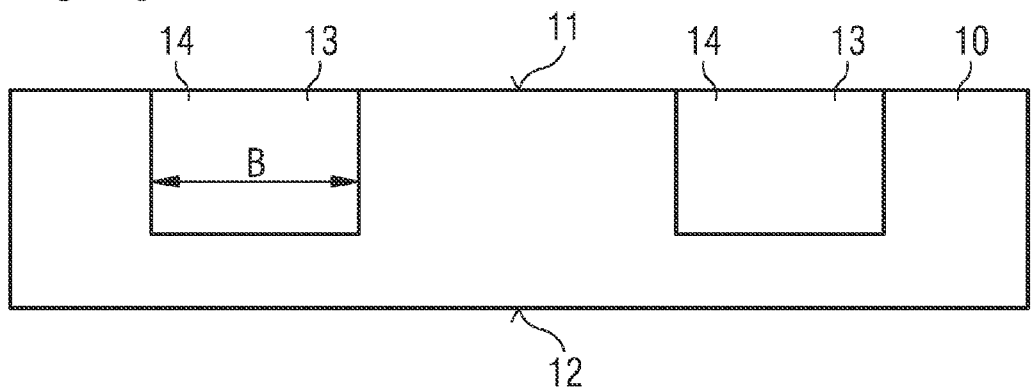

FIG. 4C shows the result of a according to the above-described embodiment for producing a first trench 14 having a width B in the semiconductor body 10 using the example of two trenches 14 produced. In this example shown, the trench 14 is completely filled with insulation material 13.

Figure 5:
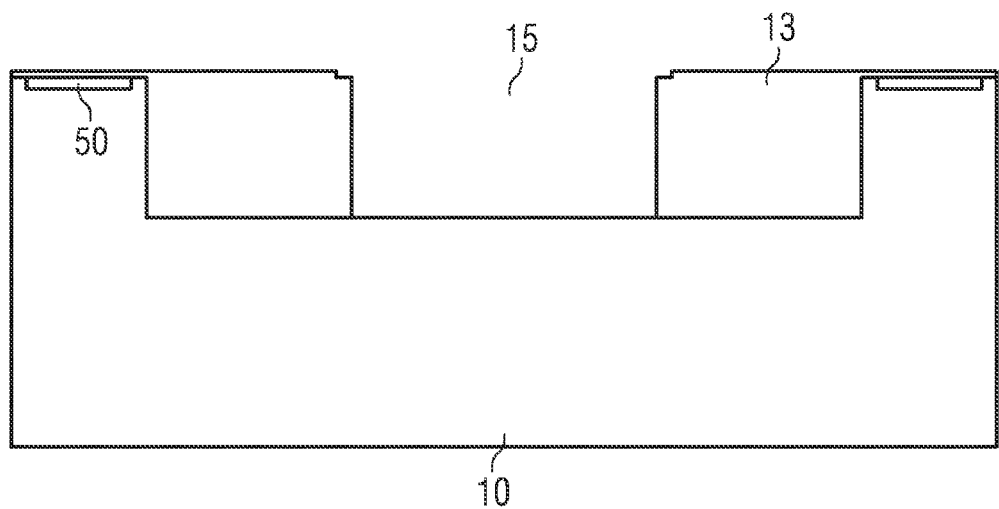
FIG. 5 shows, in a schematic cross-sectional view, an intermediate step for producing a dopant region in the semiconductor body.

FIG. 5 shows a development of the method for producing a semiconductor device having a sidewall insulation, wherein firstly a dopant region 50 is additionally formed in the semiconductor body 10 for each semiconductor device to be produced. This can be a region doped complementarily, that is to say with a different conduction type, with respect to the semiconductor body 10 or a region doped with the same conduction type as the semiconductor body 10, but with a higher dopant concentration. In this case, the production of this at least one additional dopant region 50 in the semiconductor body 10 is preferably effected after the production of the at least first trench, in order to avoid, for example, thermal influences on the dopant region 50 during the production of the first trench. In particular, one advantageous embodiment is if the dopant region 50 is implemented before the isolating trench 15 is produced. The additional dopant region 50 forms, for example, in the case of the complementary doping with respect to the semiconductor body 10, a pn junction. Such pn junctions are required for many active semiconductor components such as, e.g., diodes, transistors, thyristors, IGBTs, etc.

Figure 6:
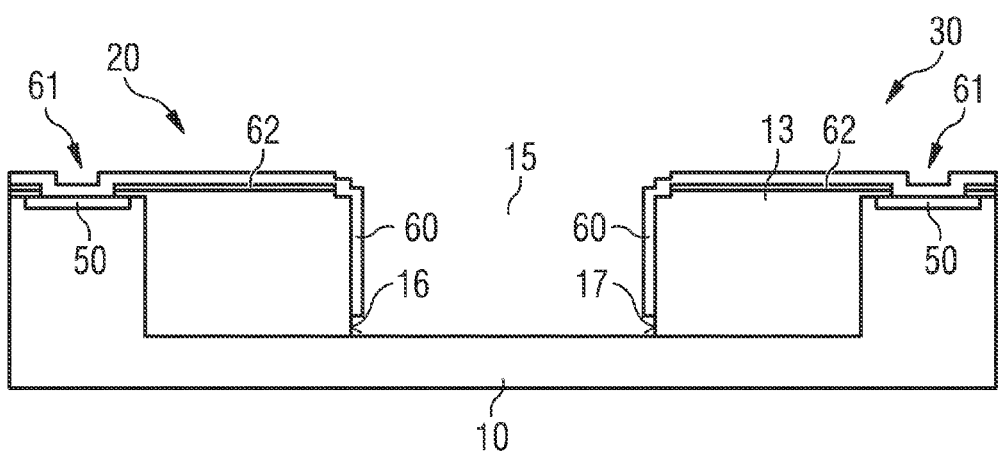
FIG. 6 shows, in a schematic cross-sectional view, an intermediate step of the method with an electrically conductive layer on the sidewall insulation.

FIG. 6 illustrates the situation in which, after the production of the isolating trench 15, an electrically conductive layer 60 was produced on the insulation material 13 of the first trench, which insulation material adjoins the sidewalls 16 and 17 of the isolating trench 15, in the isolating trench. In particular, the situation is shown in which the electrically conductive layer 60 was produced in such a way that it extends from the insulation material 13 of the first trench, which insulation material adjoins the sidewalls 16, 17 of the isolating trench 15, as far as at least one dopant region 50. In this case, the dopant region 50 and the insulation material 13 are respectively assigned to the same semiconductor device 20, 30.

In the example illustrated, the electrically conductive layer 60 is produced in such a way that it is isolated from the semiconductor body 10 over extensive parts of the surface of the semiconductor body 10 at the first side 11 by a dielectric layer 62. In the contact region 61, the dielectric layer 62 is interrupted, as a result of which the contact of the electrically conductive layer 60 with the dopant region 50 is made possible. The electrically conductive layer 60 is produced, for example, by areally applying a metal layer on the semiconductor body. In the isolating trench 15, the electrically conductive layer also deposits on the sidewalls 16, 17. In particular, this deposition of the electrically conductive layer 60 on the sidewalls 16 and 17 is fostered when the sidewalls 16 and 17 have a positive flank angle. Afterward, the electrically conductive layer 60 applied over the whole area can be patterned, for example, by photolithographic steps and subsequent etching.

Figure 7:
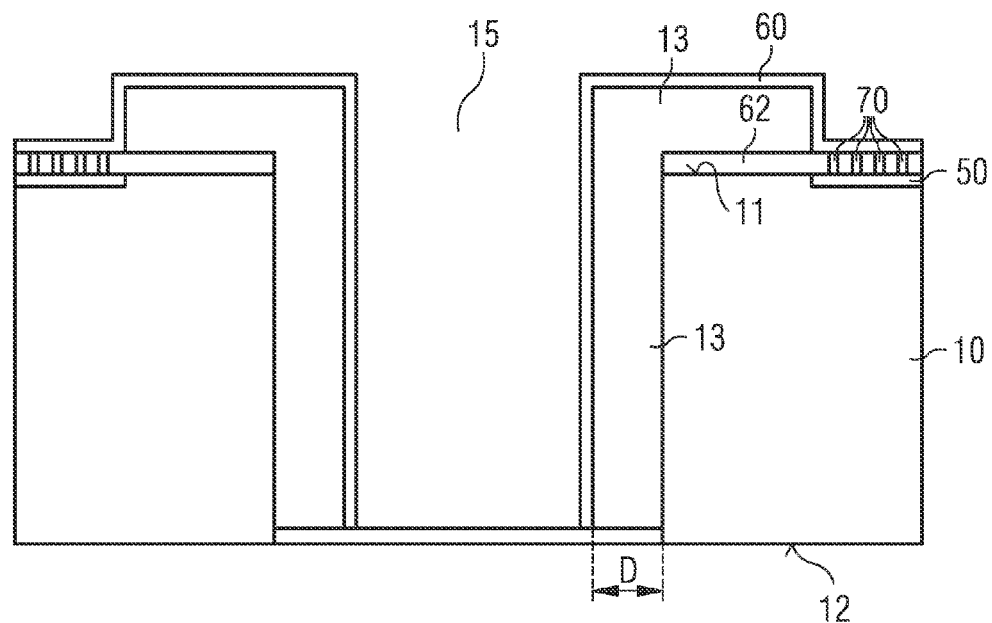
FIG. 7 shows an intermediate step of the method with a conductive layer on the sidewall insulation and with electrically conductive contact elements between the electrically conductive layer and a dopant region in the semiconductor body.

FIG. 7 shows an embodiment of the method for producing a semiconductor device having a sidewall insulation, wherein the electrically conductive layer 60 is contact-connected to the dopant region 50 via electrically conductive contact elements 70. The electrically conductive contact elements 70 extend through the dielectric layer 62 and produce an electrical connection between the dopant region 50 in the semiconductor body 10 and the electrically conductive layer 60 arranged above the dielectric layer 62. The electrically conductive layer 60 can, as illustrated in the exemplary embodiment with regard to FIG. 7, also be applied completely along the sidewall insulation on the insulation material 13. In this case, the insulation material 13 can also extend over a part of the surface of the semiconductor body 10 at the first side 11.

Figure 8:
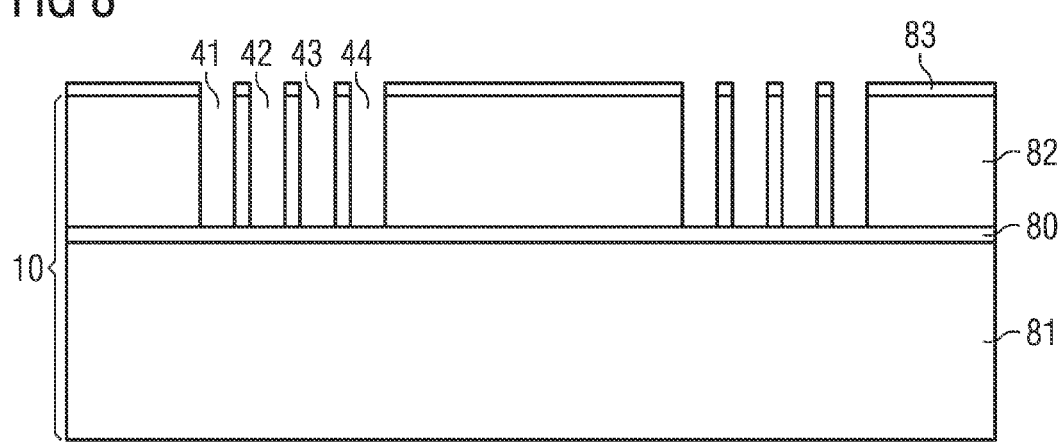
FIG. 8 shows an exemplary embodiment with an insulation layer running parallel to the surface of the semiconductor body.

FIG. 8 shows the intermediate result of an embodiment of the method for producing a semiconductor device having sidewall insulation, wherein the semiconductor body 10 is provided with an insulation layer 80 running parallel to the surface of the first side 11 of the semiconductor body 10. This can be done, e.g., by providing an SOI material, wherein the semiconductor body 10 has a lower semiconductor body part 81 and an upper semiconductor body part 82, which are isolated from one another by an insulation layer, such as, e.g., an oxide layer. The insulation layer 80 is embedded into the semiconductor body 10 in a desired depth, for example, which corresponds to the height of the later semiconductor device. The first trench 14 is thereupon produced, in the illustrated example by the formation of subtrenches 41, 42, 43 and 44, as far as the embedded insulation layer 80 in the upper semiconductor body part 82. In this case, the subtrenches 41 to 44 are produced, for example, by etching with the aid of a patterned mask 83 on the surface of the semiconductor body 10. The complete formation of the first trench 14 at least partly filled with insulation material 13 is effected according to the basic method such as has already been explained in greater detail with regard to the exemplary embodiment in accordance with FIG. 4. One advantage of this embodiment is that the first trench 14 is produced with a defined depth, namely as far as the insulation layer 80. A further advantage is that the semiconductor device thereby produced has a rear side insulated by an insulation layer 80. For this purpose, during the removal of the second side 12 of the semiconductor body 10, only the lower semiconductor body part 81 has to be removed and the insulation layer 80 has to be retained at least at the rear side of the semiconductor devices to be produced.

FIG. 9 shows, in a three-dimensional illustration, a semiconductor device which was produced according to the method described. The semiconductor device has a parallelepipedal basic shape. The semiconductor body (not visible) is provided with a thick sidewall insulation composed of an insulation material 13 at the sidewalls 90 and 91. The surface 92 of the semiconductor device likewise has at least one insulating dielectric layer 62. A plurality of electrically conductive layers 60 spaced apart from one another are formed at the sidewalls 90, 91 on the insulation material 13 and extend over the surface 92 as far as the electrical contact regions 61, in which the electrically conductive layers 60 produce an electrically conductive connection through the dielectric layer 62 to dopant regions formed in the semiconductor body.

What is claimed is:

1. A method for producing a semiconductor device having a sidewall insulation, the method comprising:
    providing a semiconductor body having a first surface and a second surface opposite the first surface;
    forming a first trench that is at least partly filled with an insulation material, the first trench extending from the first surface into the semiconductor body toward the second surface, wherein the first trench is formed between a first semiconductor body region for a first semiconductor device and a second semiconductor body region for a second semiconductor device, wherein forming the first trench comprises forming a first plurality of subtrenches alongside one another in a region where the first trench is to be formed, the first plurality of subtrenches extending from the first surface toward the second surface in such a way that a ridge of the semiconductor body is formed between the subtrenches, and converting the ridge into an insulation material, the method further comprising:
    forming an electrically conductive layer over the first trench, wherein the electrically conductive layer covers a top portion of the sidewall of the first trench, wherein the electrically conductive layer exposes a bottom portion of the sidewall of the first trench;
    forming an isolating trench that extends from the first surface of the semiconductor body toward the second surface of the semiconductor body between the first and second semiconductor body regions, wherein at least one sidewall of the isolating trench adjoins a sidewall of the first trench comprising the insulation material, wherein at least one other opposite sidewall of the isolating trench adjoins a sidewall of a semiconductor region of the semiconductor body, wherein the sidewall with the insulation material is laterally across the opposite sidewall with the semiconductor region along a plane parallel to the first surface; and
    singulating the semiconductor body to separate the first semiconductor device from the second semiconductor device, wherein singulating the semiconductor body comprises removing a portion of the semiconductor body at the second surface as far as the isolating trench.

2. The method as claimed in claim 1, wherein forming the first trench comprises forming a plurality of first trenches between the first and second semiconductor body regions, wherein the isolating trench is formed between two of the first trenches.

3. The method as claimed in claim 1, wherein the isolating trench is formed in a first trench.

4. The method as claimed in claim 1, wherein the first trench has a width B of at least 2 µm and the isolating trench is formed in such a way that an insulation layer composed of the insulation material of the first trench having a thickness D of at least 2 µm adjoins the sidewall of the isolating trench.

5. The method as claimed in claim 1, wherein forming the first trench comprises:
    forming a plurality of subtrenches alongside one another in a region where the first trench is to be formed, the subtrenches extending from the first surface toward the second surface in such a way that a ridge of the semiconductor body is formed between the subtrenches; and
    converting the ridge into an insulation material.

6. The method as claimed in claim 5, wherein an unfilled part of the subtrench remaining after converting the ridge into an insulation material is filled with a material.

7. The method as claimed in claim 6, wherein the unfilled part of the subtrench is filled with an insulation material.

8. The method as claimed in claim 7, wherein the unfilled part of the subtrench is filled with a material that has a stress-reducing effect.

9. The method as claimed in claim 5, wherein the ridge is converted into the insulation material by oxidation.

10. The method as claimed in claim 1, further comprising, after forming the first trench, forming a dopant region in the semiconductor body for the first semiconductor device.

11. The method as claimed in claim 1, further comprising, after forming the isolating trench, forming an electrically conductive layer on the insulation material of the first trench, wherein the insulation material adjoins the sidewall of the isolating trench.

12. The method as claimed in claim 10, further comprising, after forming the isolating trench, forming an electrically conductive layer on the insulation material of the first trench, wherein the insulation material adjoins the sidewall of the isolating trench, wherein the electrically conductive layer is formed in such a way that it extends from the insulation material of the first trench that adjoins the sidewall of the isolating trench as far as at least one contact region for the dopant region, wherein the dopant region and the insulation material are part of the first semiconductor device.

13. The method as claimed in claim 12, further comprising an electrically conductive contact element in the contact region between the electrically conductive layer and the dopant region, such that an electrical connection is formed between the dopant region and the electrically conductive layer.

14. The method as claimed in claim 1, further comprising forming an insulation layer in the semiconductor body parallel to the first surface.

15. The method as claimed in claim 14, wherein the first trench is formed as far as the insulation layer.

16. The method as claimed in claim 1, wherein the sidewall of the isolating trench is formed with a positive flank angle.

17. The method as claimed in claim 1, wherein, after the singulating, the first semiconductor device comprises a major sidewall including the insulation material and the second semiconductor device comprises a major sidewall exposing a portion of the semiconductor region of the semiconductor body.

18. A method for producing a semiconductor device having a sidewall insulation, the method comprising:
  providing a semiconductor body having a first surface and a second surface opposite the first surface;
  forming a first plurality of subtrenches alongside one another in a first region and a second plurality of subtrenches alongside one another in a second region, the subtrenches of the first and the second plurality of subtrenches extending from the first surface towards the second surface in such a way that a ridge of the semiconductor body is formed between the subtrenches, wherein the first and the second plurality of subtrenches is formed between a first semiconductor body region for a first semiconductor device and a second semiconductor body region for a second semiconductor device, wherein the first plurality of subtrenches is separated from the second plurality of subtrenches by a third semiconductor body region between the first and the second semiconductor body regions; and
  forming a first insulation trench from the first plurality of subtrenches and a second insulation trench from the second plurality of subtrenches by converting each of the ridge into an insulation material;
  etching a portion of the third semiconductor body region to form an isolating trench that extends from the first surface of the semiconductor body toward the second surface of the semiconductor body between the first and second semiconductor body regions, wherein a region of the first insulation trench adjoins a first sidewall of the isolating trench and a region of the second insulation trench adjoins an opposite second sidewall of the isolating trench;
  forming an electrically conductive layer over the first insulation trench and the second insulation trench, wherein the electrically conductive layer covers a top portion of the first sidewall and a top portion of the second sidewall, wherein the electrically conductive layer exposes a bottom portion of the first sidewall and a bottom portion of the second sidewall; and
  singulating the semiconductor body to separate the first semiconductor device from the second semiconductor device, wherein singulating the semiconductor body comprises removing a portion of the semiconductor body at the second surface as far as the isolating trench.

19. The method as claimed in claim 18, wherein an unfilled part of the subtrench remaining after converting the ridge into an insulation material is filled with a material.

20. The method as claimed in claim 19, wherein the unfilled part of the subtrench is filled with a material that has a stress-reducing effect.

21. A method for producing a semiconductor device, the method comprising:
  providing a semiconductor wafer having a first surface and a second surface opposite the first surface, the semiconductor wafer comprising a first semiconductor device comprising a first semiconductor region and a second semiconductor device comprising a second semiconductor region;
  between the first semiconductor region and the second semiconductor region, forming a first plurality of subtrenches and a second plurality of subtrenches separated from the first plurality of subtrenches by a third semiconductor region, wherein the first plurality of subtrenches comprise a first plurality of ridges between subtrenches of the first plurality of subtrenches and the second plurality of subtrenches comprise a second plurality of ridges between subtrenches of the second plurality of subtrenches;
  oxidizing the first plurality of ridges to form a first plurality of oxide ridges and the second plurality of ridges to form a second plurality of oxide ridges;
  filling first recesses between adjacent ones of the first plurality of oxide ridges and second recesses between adjacent ones of the second plurality of oxide ridges with amorphous silicon, wherein the amorphous silicon is configured to counteract mechanical stress generated by oxidizing the first plurality of ridges to form the first plurality of oxide ridges and the second plurality of ridges to form the second plurality of oxide ridges;
  etching a portion of the third semiconductor region to form an isolating trench that extends from the first surface of the semiconductor wafer toward the second surface of the semiconductor wafer between the first and second semiconductor regions, wherein a region of the first plurality of oxide ridges adjoins a first sidewall of the isolating trench and a region of the second plurality of oxide ridges adjoins an opposite second sidewall of the isolating trench; and
  singulating the semiconductor wafer to separate the first semiconductor device from the second semiconductor device.

* * * * *